(12) United States Patent
Chen et al.

(10) Patent No.: US 9,702,903 B2
(45) Date of Patent: Jul. 11, 2017

(54) CONNECTOR AND ELECTRONIC DEVICE

(71) Applicant: KINGSTON DIGITAL, INC., Fountain Valley, CA (US)

(72) Inventors: David Chen, Fountain Valley, CA (US); Chengvee Ong, Fountain Valley, CA (US); Chichih Yu, Hsinchu (TW)

(73) Assignee: Kingston Digital, Inc., Fountain Valley, CA (US)

( * ) Notice: Subject to any disclaimer, the term of this patent is extended or adjusted under 35 U.S.C. 154(b) by 0 days.

(21) Appl. No.: 14/297,995

(22) Filed: Jun. 6, 2014

(65) Prior Publication Data
US 2014/0362501 A1    Dec. 11, 2014

(30) Foreign Application Priority Data
Jun. 7, 2013  (TW) .............................. 102210735 U

(51) Int. Cl.
*H05K 1/00* (2006.01)
*G01R 1/04* (2006.01)

(52) U.S. Cl.
CPC .................................. *G01R 1/0466* (2013.01)

(58) Field of Classification Search
CPC ........ H01R 13/02; H01R 13/05; H01R 43/16; H01R 43/26; H01R 24/00; H05K 3/34
USPC ....... 439/66, 70, 84, 68, 626, 891, 660, 630, 439/86, 91; 29/593, 832, 840; 361/768, 361/774, 776
See application file for complete search history.

(56) References Cited

U.S. PATENT DOCUMENTS

| | | | | |
|---|---|---|---|---|
| 4,950,173 A | * | 8/1990 | Minemura | H05K 3/326 439/161 |
| 5,525,545 A | * | 6/1996 | Grube | H01L 24/72 257/E23.078 |
| 5,615,824 A | * | 4/1997 | Fjelstad | G01R 1/0466 228/180.1 |

(Continued)

FOREIGN PATENT DOCUMENTS

| | | |
|---|---|---|
| EP | 0130719 A2 | 1/1985 |
| JP | 2001021615 | 1/2001 |

OTHER PUBLICATIONS

Search Report to the corresponding United Kingdom Patent Application rendered by the UK Intellectual Property Office on Oct. 24, 2014, 4 pages.

*Primary Examiner* — Tulsidas C Patel
*Assistant Examiner* — Peter G Leigh
(74) *Attorney, Agent, or Firm* — Skaar Ulbrich Macari, P.A.

(57) ABSTRACT

A connector and an electronic device for connecting an electronic component and a testing apparatus are provided. The connector includes a substrate and a plurality of conductive resilient sheets. The substrate includes a surface and a plurality of recesses disposed on the surface. Each of the conductive resilient sheets is disposed on the surface and has an end portion sunk in the recess. And the electronic device includes the aforesaid connector and an electronic component, which is disposed on the connector and has a plurality of bumps disposed on a surface of the electronic component. The bumps touch the end portions of the conductive resilient sheets and partially sunk in the recesses. Therefore, the touching connection between the electronic component and the conductive resilient sheets can be more stable.

8 Claims, 9 Drawing Sheets

(56) References Cited

U.S. PATENT DOCUMENTS

| | | | | |
|---|---|---|---|---|
| 5,632,631 A * | 5/1997 | Fjelstad | ............... | G01R 1/0466 257/E23.067 |
| 5,802,699 A * | 9/1998 | Fjelstad | ............... | G01R 1/0466 228/180.22 |
| 5,812,378 A | 9/1998 | Fjelstad et al. | | |
| 5,962,921 A * | 10/1999 | Farnworth | ........... | G01R 1/0408 257/739 |
| 6,042,412 A * | 3/2000 | Murr | ........................ | 439/331 |
| 6,086,386 A * | 7/2000 | Fjelstad et al. | ................. | 439/70 |
| 6,142,789 A * | 11/2000 | Nolan | ............... | H01L 23/49827 439/66 |
| 6,188,301 B1 * | 2/2001 | Kornrumpf | ........... | H01H 1/0036 333/101 |
| 6,246,249 B1 * | 6/2001 | Fukasawa | ........... | G01R 31/2886 324/756.02 |
| 6,293,808 B1 * | 9/2001 | Ochiai | ............... | H01R 12/7094 439/70 |
| 6,310,484 B1 * | 10/2001 | Akram | ............... | G01R 1/07342 324/754.16 |
| 6,407,927 B1 * | 6/2002 | Fasano | ............... | H01L 23/49816 257/E23.069 |
| 6,437,591 B1 * | 8/2002 | Farnworth | ........... | G01R 1/0466 324/756.02 |
| 6,474,997 B1 * | 11/2002 | Ochiai | ............... | H01R 12/7094 439/66 |
| 6,498,503 B2 * | 12/2002 | Akram | ............... | G01R 1/07342 324/750.05 |
| 6,517,362 B2 * | 2/2003 | Hirai | ....................... | H01L 24/72 257/E23.078 |
| 6,882,169 B2 * | 4/2005 | Maruyama et al. | ..... | 324/756.05 |
| 6,905,343 B1 * | 6/2005 | Neidich | ......................... | 439/66 |
| 6,980,017 B1 * | 12/2005 | Farnworth | ........... | G01R 1/0466 324/755.07 |
| 7,043,831 B1 * | 5/2006 | Farnworth | ........... | G01R 1/0466 29/825 |
| 7,056,131 B1 * | 6/2006 | Williams | ............. | H05K 3/4092 439/66 |
| 7,317,322 B2 * | 1/2008 | Farnworth | ........... | G01R 1/0466 324/754.08 |
| 7,887,336 B2 * | 2/2011 | Nikaido | ........... | H01L 23/49827 439/591 |
| 7,963,775 B2 * | 6/2011 | Reisinger | ........... | H01R 12/7082 439/67 |
| 8,007,287 B1 * | 8/2011 | Champion et al. | ............. | 439/66 |
| 2003/0042595 A1 | 3/2003 | Canella | | |
| 2003/0216076 A1 | 11/2003 | He | | |
| 2004/0053539 A1 | 3/2004 | Watanabe | | |
| 2004/0201390 A1 * | 10/2004 | Farnworth | ........... | G01R 1/0466 324/754.08 |
| 2005/0202696 A1 | 9/2005 | Hsiao et al. | | |
| 2006/0024987 A1 * | 2/2006 | Huang et al. | .................... | 439/66 |
| 2007/0155196 A1 * | 7/2007 | Cheng et al. | .................... | 439/66 |
| 2007/0178719 A1 * | 8/2007 | Mendenhall et al. | .......... | 439/66 |
| 2008/0018353 A1 | 1/2008 | Thamarayoor | | |
| 2010/0029102 A1 * | 2/2010 | Chen et al. | ...................... | 439/66 |

* cited by examiner

CONNECTOR AND ELECTRONIC DEVICE

PRIORITY

This application claims priority to Taiwan Patent Application No. 102210735 filed on Jun. 7, 2013, which is hereby incorporated herein by reference in its entirety.

FIELD

The present invention provides a connector and an electronic device. In particular, the present invention provides a connector for connecting an electronic component to be tested with a testing apparatus and an electronic device comprising the connector.

BACKGROUND

As people have come to rely on electronic products, the performances of electronic products have to be continuously improved to satisfy consumer demands. Therefore, to provide a higher processing speed and a larger transmission capacity, the electronic products are now made to have a higher clock rate and, correspondingly, higher requirements are imposed on the quality of the signal transmission to achieve the desired transmission efficiency. In addition to the design of electronic components themselves, the method in which the electronic components are connected with other devices also has a considerable effect on the quality of the signal transmission.

For example, in the field of electronic device testing, the testing apparatus has to frequently switch between electronic components that need to be tested, so the electronic components must be plugged in and removed repeatedly. If, an electronic component has a pin contact and the corresponding contact position of the testing apparatus is still in the form of a recess, the electronic component that is to be tested is likely to be damaged during the testing due to the plug-in and removal of the pin. Therefore, unlike common devices interacting with tested device, the testing apparatus usually comprises a connector which is easy to plug in and remove so that damages to the tested electronic device or testing apparatus can be avoided.

However, conventional technology has the following drawbacks: the contact portion between the tested electronic component with a pin contact and a connector is in the shape of a point or a line. In a case where the contact is unstable, the electronic signal will be affected negatively. For example, when the connector with a pogo pin makes contact with a tested electronic component, usually the contact therebetween is unstable and the oxidized surface of the pogo pin will also affect the electronic signal.

On the other hand, although the tested electronic component with a bump pin can be connected to the connector in the form of a resilient sheet rapidly, the contact between the bump and the resilient sheet is not so stable, thereby, affecting the reliability of the testing.

Accordingly, a better solution to the aforementioned problems needs to be provided.

SUMMARY

A primary objective of certain embodiments of the present invention includes providing a connector which can be used for connecting a testing apparatus and a to-be-tested electronic component. The connector is to stably make contact with the testing apparatus and the electronic component.

To achieve the aforesaid objective in certain embodiments, the connector includes a first substrate and a plurality of first conductive resilient sheets. The substrate comprises a first surface and a plurality of first recesses disposed on the first surface. The first conductive resilient sheets are disposed on the first surface, and each of the first conductive resilient sheets includes an end portion sunken into one of the first recesses.

Another objective of certain embodiments of the present invention includes providing an electronic device. The electronic device can provide an electronic component and a connector which can stably make contact with each other. To achieve the aforesaid objective in certain embodiments, the electronic device includes: a connector as described above; an electronic component that is above the connector with a plurality of bumps disposed on the surface thereof. The bumps make contact with the end portions of the first conductive resilient sheets respectively and are partially sunken into the first recesses.

The detailed technology and preferred embodiments implemented for the subject invention are described in the following paragraphs accompanying the appended drawings for people skilled in this field to well appreciate the features of the claimed invention.

BRIEF DESCRIPTION OF THE DRAWINGS

FIG. 2B is also a cross-sectional view of an electronic component according to the first embodiment of the present invention;

DETAILED DESCRIPTION

In the following descriptions, the present invention will be explained with reference to various example embodiments; nevertheless, these embodiments are not intended to limit the present invention to any specific example, environment, application, or particular implementation described herein. Therefore, descriptions of these example embodiments are only provided for purpose of illustration rather than to limit the present invention. The various features or aspects discussed herein can also be combined in additional combinations and embodiments, whether or not explicitly discussed herein, without departing from the scope of the invention.

Figure 1A:
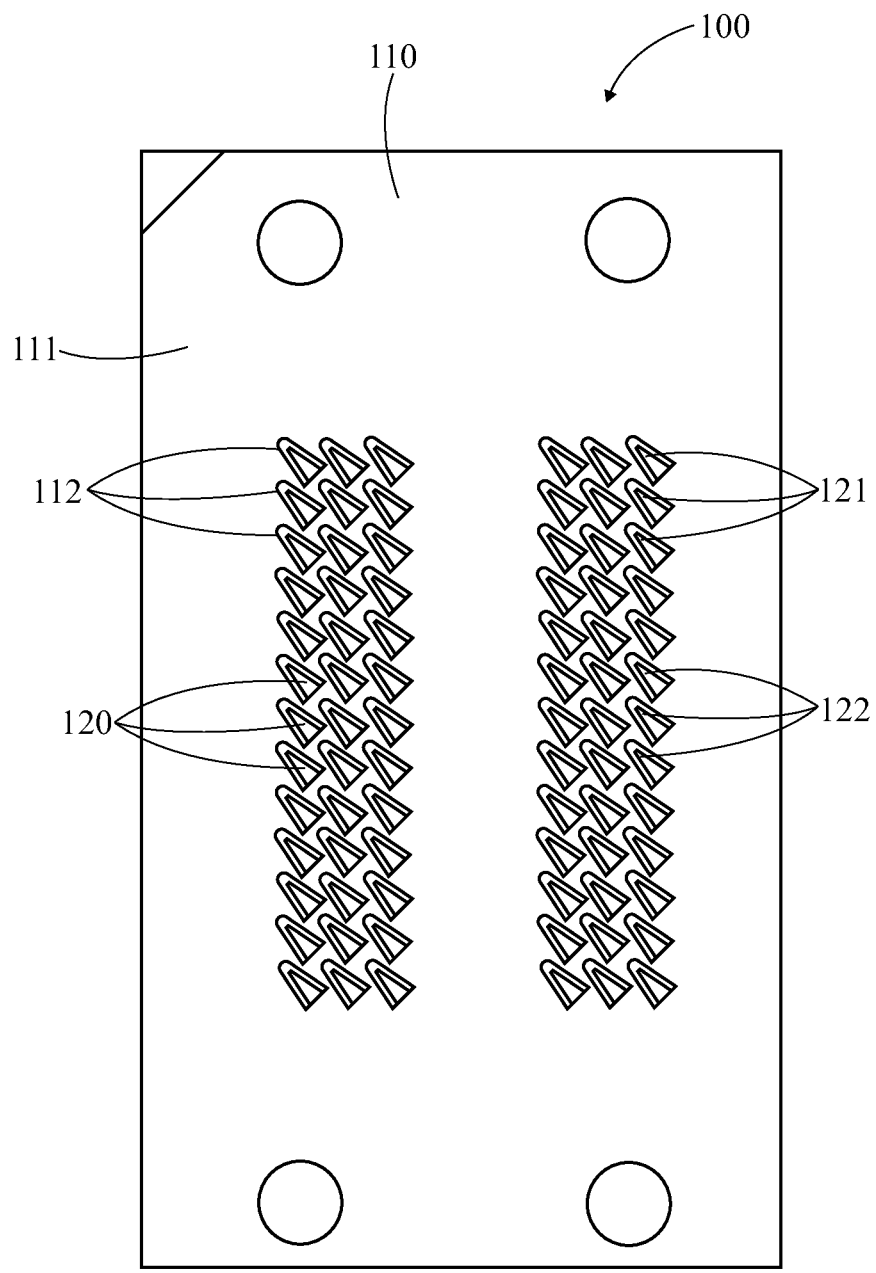
FIG. 1A is a top view of a connector according to the first embodiment of the present invention.
Figure 1B:
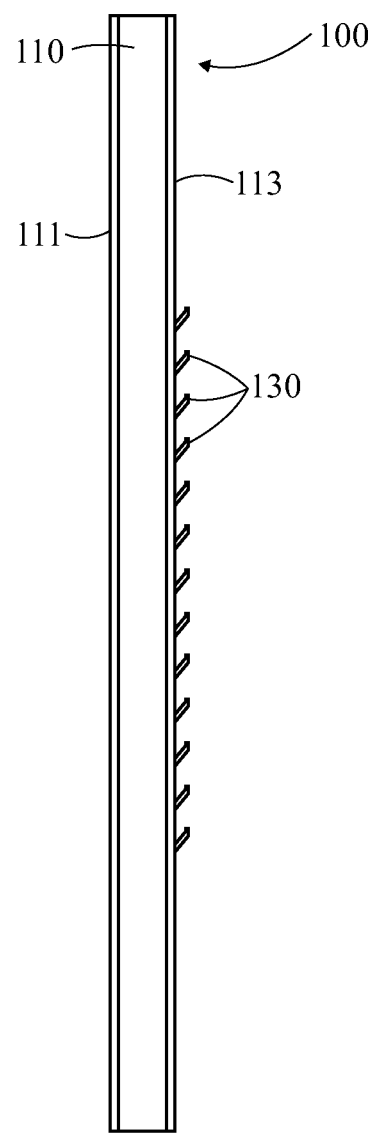
FIG. 1B is a side view of the connector according to the first embodiment of the present invention.
Figure 1C:
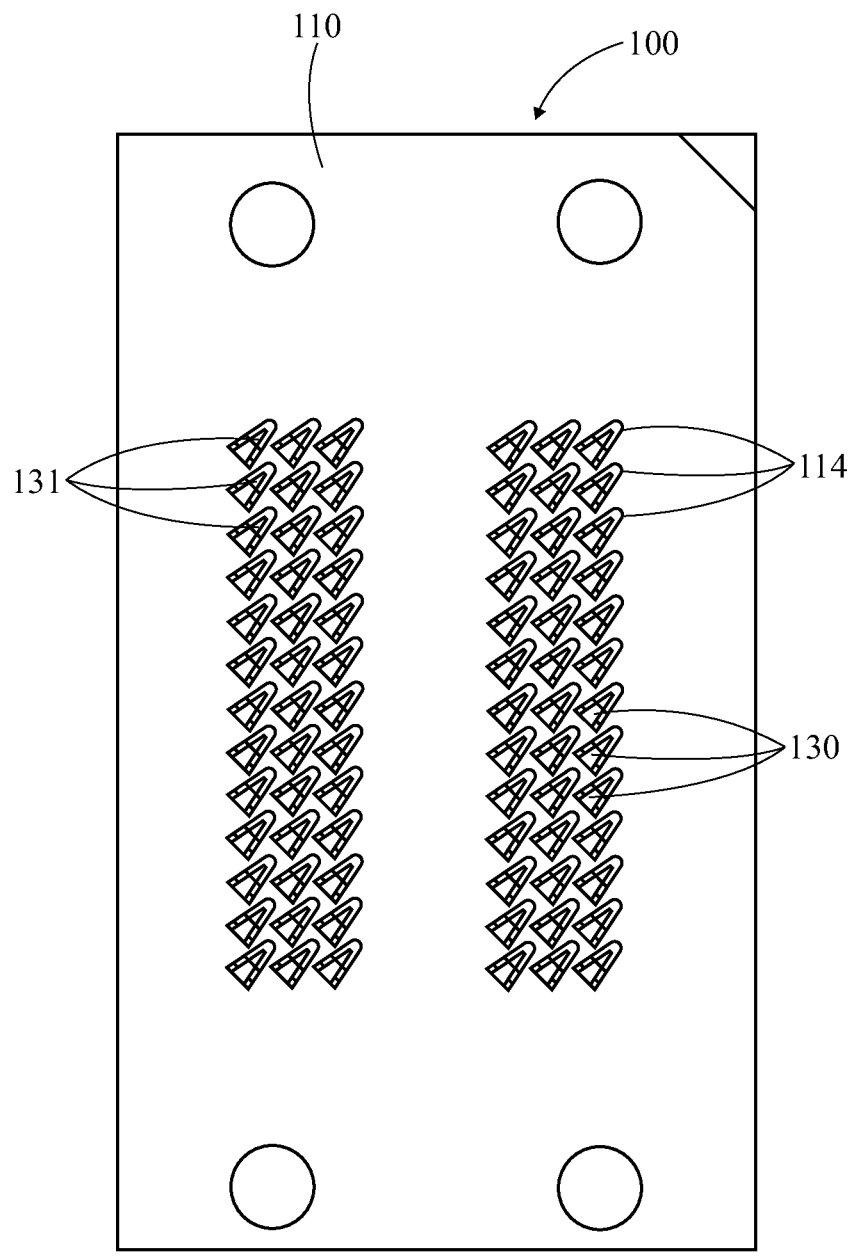
FIG. 1C is a bottom view of the connector according to the first embodiment of the present invention.

FIGS. 1A to 1C illustrate a top view, side view and bottom view of a connector according to the first embodiment of the present invention. In the first embodiment, a connector 100 is proposed for connecting a testing apparatus (not shown) and an electronic component 10 (with reference to FIG. 2B) to achieve electrical connection between the testing apparatus and the electronic component 10. The connector 100 may comprise a substrate 110 and a plurality of first conductive resilient sheets 120. The substrate 110 may comprise a first surface 111 and a plurality of first recesses 112 disposed on the first surface 111.

Figure 2A:
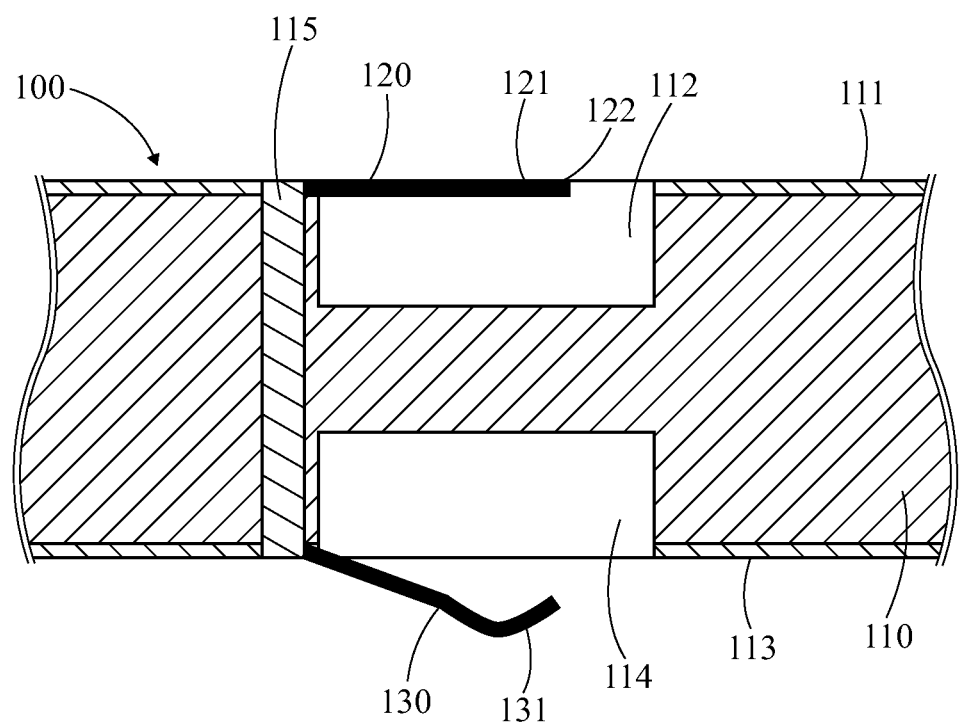
FIG. 2A is a cross-sectional view of the connector according to the first embodiment of the present invention.

FIG. 2A illustrates a cross-sectional view of the connector according to the first embodiment of the present invention. Because FIG. 2A focuses on the relative relationships between the first conductive resilient sheets and the substrate, only one first conductive resilient sheet is shown therein. As shown, the first conductive resilient sheets 120 may have the shape of a flat plate and are disposed into the first recesses 112 of the first surface 111 respectively. Each of the first conductive resilient sheets 120 may include an end portion 121 sunken into one of the first recesses 112. In other words, the end portions 121 of the first conductive resilient sheets 120 are received in the first recesses 112 to be suspended therein without protruding out of the first surface 111 of the substrate 110.

The end portions 121 have a surface 122 which may be a top surface of the end portions 121. The surface 122 may be coplanar with the first surface 111. Therefore, the first conductive resilient sheets 120 may also be called planar resilient sheets.

Figure 2B:
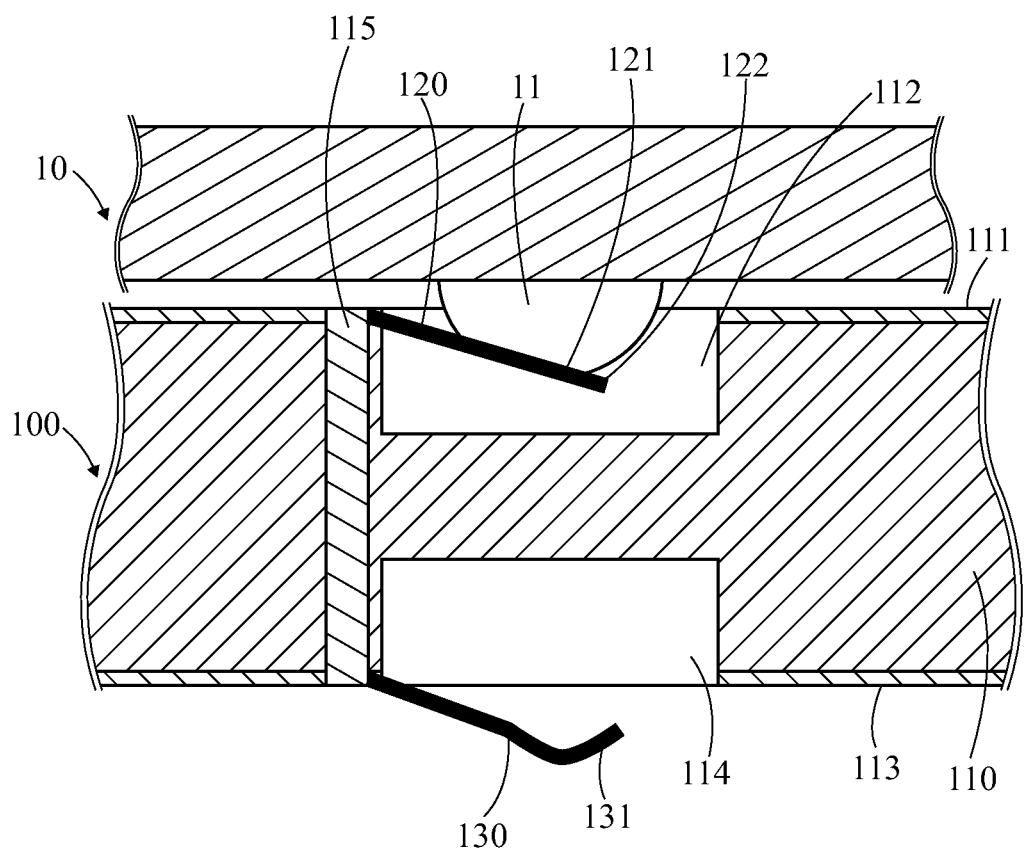
FIG. 2B is a cross-sectional view illustrating the contact between the connector and the a to-be-tested component according to the first embodiment of the present invention.

Next, with reference to FIG. 2B, a cross-sectional view illustrating the contact between the connector and the tested component according to the first embodiment of the present invention is shown therein. The electronic component 10 may be an electronic component such as a chip, and it may comprise a plurality of bumps 11 (only one is shown for illustration) disposed on a surface (e.g., a lower surface) of the tested electronic component 10. When the electronic component 10 is tested, first the bumps 11 may be aligned with the first recesses 112 respectively, and then the bumps 11 make contact with the end portions 121 of the first conductive resilient sheets 120 to achieve electrical connection therebetween. At this point, the electronic component 10 is located on the connector 100, and the bumps 11 are partially sunk into the first recesses 112.

Because the first conductive resilient sheets 120 are made of a resilient conductive material, the bumps 11 can partially sink into the first recesses 112 while the bumps 11 press the first conductive resilient sheets 120. As a result, the surface 122 of the end portion 121 of each of the first conductive resilient sheets 120 are offset instead of being coplanar with the first surface 111 of the substrate 110. Specifically, offsetting refers to an incline or bent positioning of the first conductive resilient sheet 120 so that the end portion 121 of the first conductive resilient sheet 120 further move towards the first recess 112.

Because both the end portion 121 and the bump 11 are in the first recess 112 when the end portion 121 of the first conductive resilient sheet 120 makes contact with the bump 11, the end portion 121 can stably make contact with the bump 11. Because of the stable contact between the end portion 121 and the bump 11, the signal integrity of electronic signals will be satisfactory during the transmission of the electronic signals between the connector 100 and the electronic component 10 and the testing result will be more reliable.

On the other hand, when the bump 11 presses the end portion 121 of the first conductive resilient sheet 120, friction exists between the end portion 121 and the bump 11, which can remove the oxide layer (i.e., the rusted layer) of the end portion 121 or the bump 11 to make the electrical connection between the end portion 121 and the bump 11 better.

With reference back to FIG. 1C and FIG. 2B, the connector 100 may further comprise a plurality of electrical contacts 130 for connecting with the electrical contacts (e.g., bumps, not shown) of the testing apparatus. The substrate 100 further comprises a second surface 113 opposite to the first surface 111. The electrical contacts 130 are disposed on the second surface 113 and electrically connected with the first conductive resilient sheets 120 respectively.

The electrical connection between the electrical contacts 130 and the first conductive resilient sheets 120 may be achieved in the following way: a plurality of conductive vias 115 is embedded into the substrate 110 between the first surface 111 and the second surface 113, with one end of each of the conductive vias 115 electrically connected with one of the first conductive resilient sheets 120 and the other end of the conductive vias 115 electrically connected with one of the electrical contacts 130. In addition to the conductive vias 115, metal interconnectors (not shown) may also be disposed in the substrate 110 to electrically connect the first conductive resilient sheets 120 and the electrical contacts 130.

The electrical contacts 130 may be any kind of conductive structures, such as conductive resilient sheets, bumps, probes or pogo pins. In the present embodiment, each of the electrical contacts 130 is a second conductive resilient sheet 130 comprising an end portion 131. In this case, the substrate 110 may comprise a plurality of second recesses 114 disposed on the second surface 113. The end portions 131 of the second conductive resilient sheets 130 protrude from the second recesses 114 respectively.

Other kinds of electrical contacts 130 will be described in the following embodiments.

Figure 3:
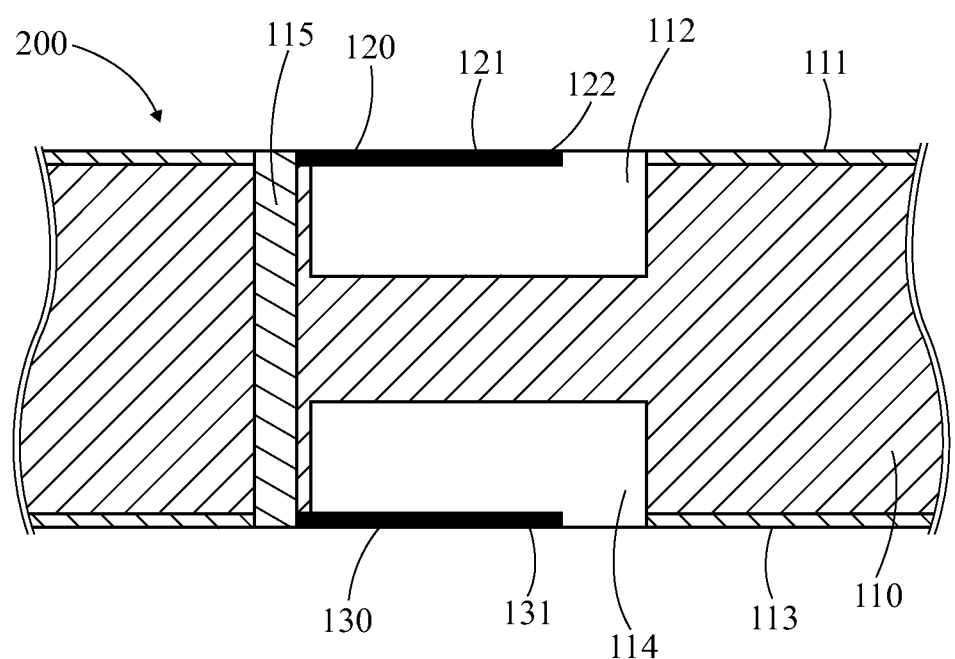
FIG. 3 is a cross-sectional view of a connector according to a second embodiment of the present invention.

FIG. 3 illustrates a cross-sectional view of a connector according to a second embodiment of the present invention. In the second embodiment, another connector 200 is proposed. The connector 200 is similar to the connector 100 of the first embodiment except that: the second conductive resilient sheets (electrical contacts) 130 of the connector 200 have the same configuration as the first conductive resilient sheets 120. That is, the end portions 131 of the second conductive resilient sheets 130 are also sunken into the second recesses 114, and a surface of each of the end portions 131 is also coplanar with the second surface 113. Thus, the second conductive resilient sheets 130 can also have functions of the first conductive resilient sheets 120; that is, the end portions 131 of the second conductive resilient sheets 130 can make stable contact with the electrical contacts (not shown) of the testing apparatus.

Figure 4:
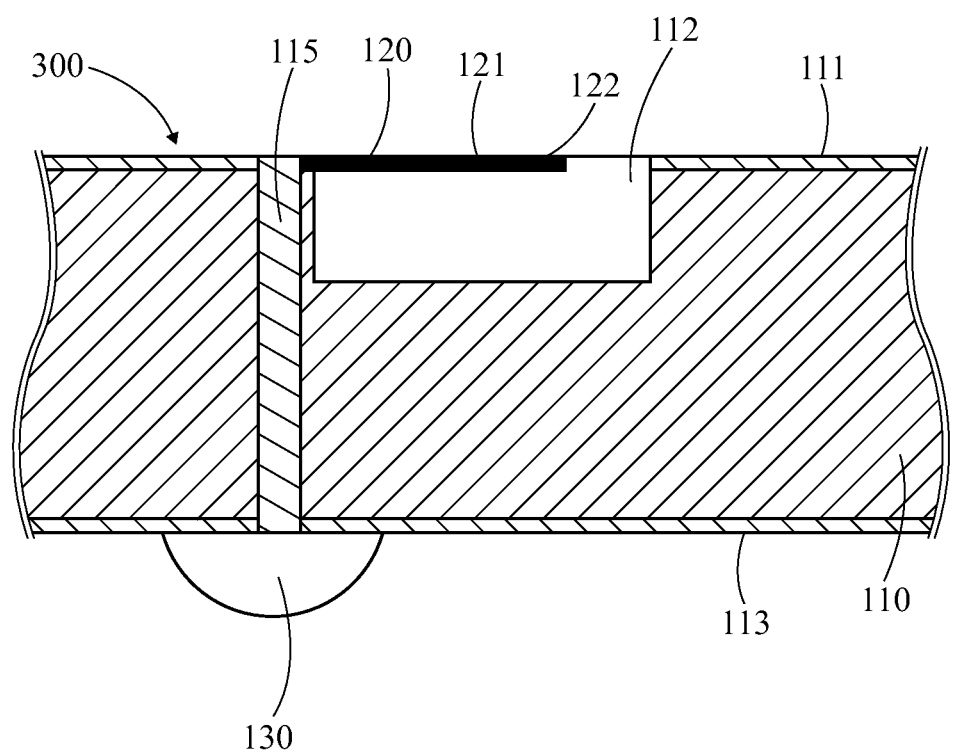
FIG. 4 is a cross-sectional view of a connector according to a third embodiment of the present invention.

FIG. 4 illustrates a cross-sectional view of a connector according to a third embodiment of the present invention. The connector 300 of the third embodiment is similar to the connector 100 of the first embodiment except that the electrical contacts 130 of the connector 300 are a plurality of bumps 130, and the second recesses may be omitted in the substrate 110.

Figure 5:
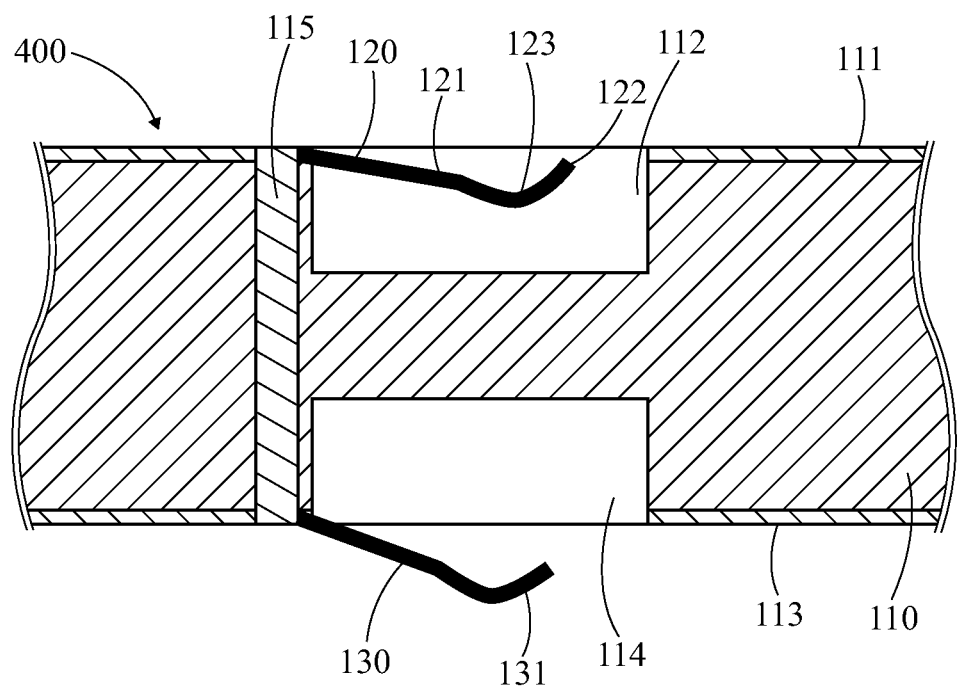
FIG. 5 is a cross-sectional view of a connector according to a fourth embodiment of the present invention.

FIG. 5 illustrates a cross-sectional view of a connector according to a fourth embodiment of the present invention. Unlike the connector 100 of the first embodiment, the surfaces 122 of the end portions 121 have already been offset instead of being coplanar with the first surface 111 before the end portions 121 of the first conductive resilient sheets 120 of the connector 400 make contact with the electronic component (not shown) in the fourth embodiment. Therefore, when the electronic component is electrically connected with the connector 400, the bumps of the electronic component can further sink into the first recesses 112 to be better received.

Furthermore, each of the first conductive resilient sheets 120 may have a receiving recess 123 which may be disposed on the end portion 122 of the first conductive resilient sheet 130, and the receiving recess 123 may have a circular or elliptical outline. The receiving recess 123 can increase the contact area between the end portion 122 and the bump of the electronic component.

Figure 6:
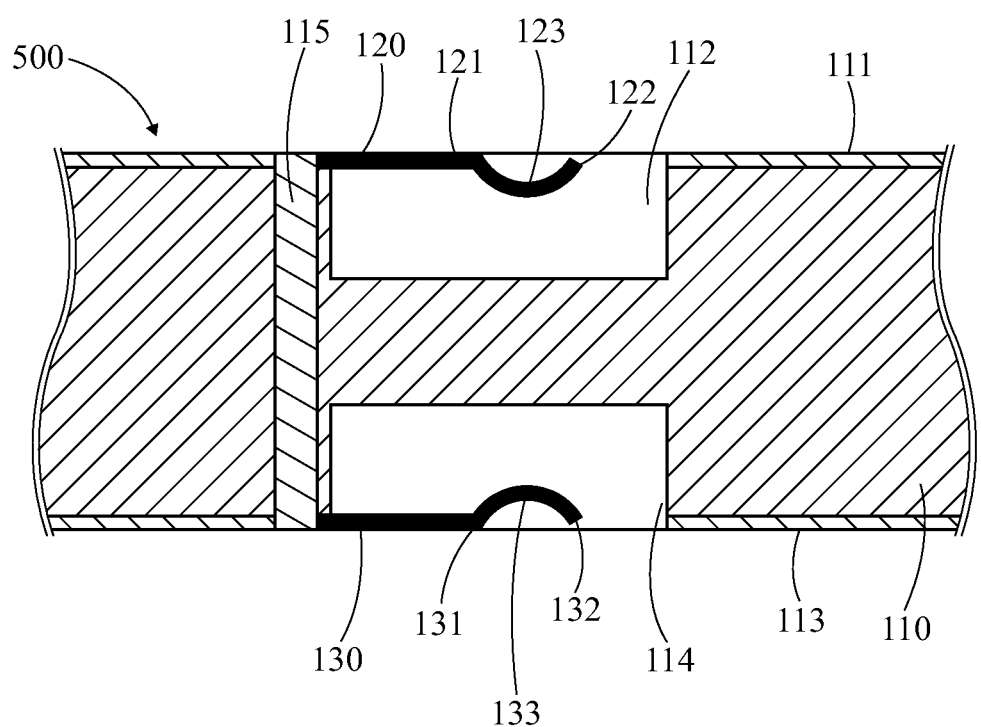
FIG. 6 is a cross-sectional view of a connector according to a fifth embodiment of the present invention.

FIG. 6 illustrates a cross-sectional view of a connector according to a fifth embodiment of the present invention. The connector 500 of the fifth embodiment differs from the connector 100 of the first embodiment in that each of the first conductive resilient sheets 120 of the connector 500 may comprise a receiving recess 133, and each of the second conductive resilient sheets 130 may also have a receiving recess 133 disposed on the end portion 131 of the second conductive resilient sheet 130. In this way, the receiving recess 133 can increase the contact area between the end portion 131 and the electrical contact of the testing apparatus.

According to the above descriptions, all connectors proposed by the embodiments of the present invention can make contact with the testing apparatus or the tested electronic component to achieve the objectives of the present invention.

Additionally, after the connectors of the embodiments are connected with the electronic component, an electronic device 1 (as shown in FIG. 2B) can be formed. In other words, the present invention also provides an electronic device 1 which may comprise the connector 100, 200, 300, 400 or 500 of one of the aforesaid embodiments and an electronic component 10. For technical contents of the electronic device 1, reference may be made to the above paragraphs, so it will not be further described herein. The electronic device 1 may have the features of the connector 100, 200, 300, 400, or 500.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A connector for connecting a testing apparatus and an electronic component, the connector comprising:
   a substrate comprising a first surface, a second surface being opposite to the first surface, a plurality of first recesses disposed on the first surface and a plurality of second recesses disposed on the second surface;
   a plurality of first conductive resilient sheets disposed on the first surface, and
   a plurality of second conductive resilient sheets disposed on the second surface and electrically connected with the first conductive resilient sheets
   wherein each of the first conductive resilient sheets includes an end portion sunk into one of the first recesses, and each of the second conductive resilient sheets includes an end portion sunk into one of the second recesses;
   wherein each of the first conductive resilient sheets has a receiving recess which has a circular or elliptical outline, and the receiving recesses are disposed on the end portions of the first conductive resilient sheets respectively.

2. The connector according to claim 1, wherein each of the end portions of the first conductive resilient sheets has a surface being coplanar with the first surface.

3. The connector according to claim 1, wherein each of the end portions of the first conductive resilient sheets has a surface being offset to the first surface.

4. The connector according to claim 1, wherein the substrate further comprises a plurality of conductive vias disposed between the first surface and second surface, and the conductive vias are electrically connected with the first conductive resilient sheets respectively and further connected with the second conductive resilient sheets respectively.

5. The connector according to claim 1, wherein each of the second conductive resilient sheets has a receiving recess and the receiving recesses of the second conductive resilient sheets are disposed on the end portions of the second conductive resilient sheets respectively.

6. An electronic device comprising:
   a connector according to claim 1; and
   an electronic component, being above the connector and having a plurality of bumps disposed on a surface thereof;
   wherein the bumps are partially sunk into the first recesses respectively and are in contact with the receiving recesses to connect with the end portions of the first conductive resilient sheets respectively.

7. The electronic device according to claim 6, wherein each of the end portions of the first conductive resilient sheets has a surface being coplanar with the first surface.

8. The electronic device according to claim 6, wherein each of the end portions of the first conductive resilient sheets has a surface being offset to the first surface.

* * * * *